(12) United States Patent
Chen et al.

(10) Patent No.: US 11,728,558 B2
(45) Date of Patent: Aug. 15, 2023

(54) SEMICONDUCTOR STRUCTURE INCLUDING ANTENNA

(71) Applicant: SJ SEMICONDUCTOR (JIANGYIN) CORPORATION, Jiangyin (CN)

(72) Inventors: Yenheng Chen, Jiangyin (CN); Chengtar Wu, Jiangyin (CN); Jangshen Lin, Jiangyin (CN); Chengchung Lin, Jiangyin (CN)

( * ) Notice: Subject to any disclaimer, the term of this patent is extended or adjusted under 35 U.S.C. 154(b) by 0 days.

(21) Appl. No.: 17/531,071

(22) Filed: Nov. 19, 2021

(65) Prior Publication Data

US 2022/0077567 A1 Mar. 10, 2022

Related U.S. Application Data

(62) Division of application No. 16/212,436, filed on Dec. 6, 2018, now Pat. No. 11,211,687.

(30) Foreign Application Priority Data

Dec. 7, 2017 (CN) .......................... 201711282003.9
Dec. 7, 2017 (CN) .......................... 201721686053.9

(51) Int. Cl.
*H01Q 1/22* (2006.01)
*H01Q 1/38* (2006.01)
(Continued)

(52) U.S. Cl.
CPC ....... *H01Q 1/2283* (2013.01); *H01L 21/4846* (2013.01); *H01L 23/49838* (2013.01); *H01L 23/66* (2013.01); *H01Q 1/36* (2013.01); *H01Q 1/38* (2013.01); *H01Q 21/0087* (2013.01); *H01Q 21/061* (2013.01); *H01Q 21/065* (2013.01); *H01L 2223/6677* (2013.01); *H01L 2224/04105* (2013.01)

(58) Field of Classification Search
CPC ......... H01L 21/4846; H01L 2223/6677; H01L 2224/04105; H01L 23/145; H01L 23/49822; H01L 23/49838; H01L 23/66; H01Q 1/2283; H01Q 1/36
See application file for complete search history.

(56) References Cited

U.S. PATENT DOCUMENTS 9,431,369 B2 * 8/2016 Chih .................. H01L 23/66
11,211,687 B2 * 12/2021 Chen ................. H01L 21/4846
(Continued)

*Primary Examiner* — Minh N Trinh
(74) *Attorney, Agent, or Firm* — Alston & Bird LLP

(57) ABSTRACT

The present disclosure provides a semiconductor structure with an antenna and a method making the same. The semiconductor structure has an antenna substrate with a first surface and a second surface opposite to the first surface; an antenna module disposed on the first surface of the antenna substrate; and a redistribution layer disposed on the second surface of the antenna substrate. The semiconductor structure with the antenna according to the present application provides the antenna module and the redistribution layer on two opposite surfaces of the antenna substrate, the material of the antenna substrate for supporting the antenna module can be selected according to actual needs, to provide more options. Signal loss can be reduced through the selection of the antenna substrate; the redistribution layer is provided on the surface of the antenna substrate for bonding the semiconductor chips.

9 Claims, 4 Drawing Sheets

(51) Int. Cl.
*H01Q 21/00* (2006.01)
*H01Q 21/06* (2006.01)
*H01Q 1/36* (2006.01)
*H01L 23/498* (2006.01)
*H01L 23/66* (2006.01)
*H01L 21/48* (2006.01)

(56) References Cited

U.S. PATENT DOCUMENTS

2012/0104574 A1\* 5/2012 Boeck ............... H01Q 1/44
  257/773
2016/0329299 A1\* 11/2016 Lin ................ H01L 23/5389
2017/0033062 A1\* 2/2017 Liu ................. H01L 23/528
2022/0077567 A1\* 3/2022 Chen ................ H01L 23/66

\* cited by examiner

SEMICONDUCTOR STRUCTURE INCLUDING ANTENNA

CROSS REFERENCES TO RELATED APPLICATIONS

This application is the divisional application of now U.S. patent Ser. No. 11/211,687 issued on Dec. 28, 2021, entitled "SEMICONDUCTOR STRUCTURE WITH AN ANTENNA AND METHOD MAKING THE SAME". This application claims the benefits of priority to U.S. patent Ser. No. 11/211,687 filed Dec. 6, 2018, Chinese Patent Application No. CN2017112820039, entitled "Semiconductor Structure With an Antenna and Method Making the Same", filed with CNIPA on Dec. 7, 2017, and Chinese Patent Application No. CN2017216860539, entitled "Semiconductor Structure With Antenna", filed with CNIPA on Dec. 7, 2017, the contents of which are incorporated herein by reference in its entirety.

TECHNICAL FIELD

The present disclosure relates to the technical field of semiconductor, in particular, to semiconductor chip packaging.

BACKGROUND

To achieve a better communication effect, radio frequency chips are generally provided with antennas during use. A fan-out wafer level packaging method of the radio frequency chips generally comprises the following steps: providing a carrier substrate and forming an adhesive layer on a surface of the carrier; patterning and electroplating on the adhesive layer to obtain a redistribution layer (RDL); mounting the radio frequency chip on the redistribution layer by adopting a chip bonding process; packaging the chip in a plastic packaging material layer by adopting an injection molding process; forming an antenna on the surface of the plastic packaging material layer; removing the carrier and the adhesive layer; photo-etching and electroplating on the redistribution layer to form an Under-Bump Metal (UBM) layer; performing ball placement and reflow on the UBM layer to form a solder ball bump; and then performing wafer bonding and dicing. Accordingly, in the existing radio frequency chip packaging structure, the radio frequency chip is packaged in the plastic packaging material layer, and the antenna can only be fabricated on the surface of the plastic packaging material layer and used in conjunction with the radio frequency chip. However, the packaging structure has the following problems: the material layer in contact with the antennas for the radio frequency chip has little choice but plastic, therefore the loss of the antenna signal is large, and it is not flexible to arrange the structures of the antenna relative to the radio frequency chip.

SUMMARY

The present disclosure provides a semiconductor structure with an antenna, comprising: an antenna substrate comprising a first surface and a second surface opposite to the first surface; an antenna module disposed on the first surface of the antenna substrate; and a redistribution layer disposed on the second surface of the antenna substrate.

Preferably, the antenna substrate comprises a glass substrate, a silicon substrate, a Roger 5880 substrate, a polymer substrate or a composite substrate.

Preferably, the antenna module comprises a plurality of antenna units, wherein the plurality of the antenna units each is a block antenna or a spiral antenna.

Preferably, the plurality of antenna units is distributed in a single layer on the first surface of the antenna substrate.

Preferably, the plurality of antenna units each comprises a stack of antenna layers, and wherein the plurality of antenna units is distributed with a space from each other, and wherein two adjacent antenna layers are connected to each other.

Preferably, the antenna module further comprises a dielectric layer, and wherein the dielectric layer is disposed between two adjacent antenna layers of the antenna units.

Preferably, each antenna layer of one of the antenna units comprises an array of antennas, distributed in an annulus, having regular or irregular spaces from each other, in a plane of the first surface of the antenna substrate.

Preferably, the redistribution layer comprises: an insulating layer disposed on the second surface of the antenna substrate; at least one metal wire layer disposed in the insulating layer; and an Under-Bump Metal layer disposed on a surface of the insulating layer, and electrically connecting to the metal wire layer.

The present application further provides a method for fabricating a semiconductor structure with an antenna, comprising the following steps:

1) providing an antenna substrate, wherein the antenna substrate comprises a first surface and a second surface opposite to the first surface;
2) forming an antenna module on the first surface of the antenna substrate; and
3) forming a redistribution layer on the second surface of the antenna substrate.

Preferably, the antenna substrate provided in step 1) comprises a glass substrate, a silicon substrate, a Roger 5880 substrate, a polymer substrate or a composite substrate.

Preferably, in step 2), forming the antenna module on the first surface of the antenna substrate wherein the antenna module comprises a plurality of antenna units arranged in an array, wherein the plurality of antenna unites each is a block antenna or a spiral antenna, wherein the array is in rectangular ring shape, and wherein a space between two adjacent antenna units is not fixed.

Preferably, in step 2), forming the antenna module on the first surface of the antenna substrate further comprises the following steps: 2-1) forming a first layer of a plurality of antenna units on the first surface of the antenna substrate, wherein the first layer of the plurality of the antenna units are distributed in an array, wherein the array is distributed in an annulus, having fixed or unfixed spaces from each other, in a plane of the first surface of the antenna substrate; 2-2) forming a first dielectric layer on the first surface of the antenna substrate, wherein the first dielectric layer covers the antenna units; 2-3) forming a conductive plug in the first dielectric layer, wherein the; and 2-4) forming a second layer of a plurality of antenna units on the surface of the first dielectric layer, wherein the second layer of the plurality of antenna units are distributed in an array, wherein the array is in an annulus, having fixed or unfixed spaces between two adjacent antenna units.

Preferably, the method further comprises the following steps after step 2-4): 2-5) forming a second dielectric layer on the surface of the first dielectric layer, wherein the second dielectric layer covers the plurality of antenna units; 2-6) forming a conductive plug in the second dielectric layer, wherein the conductive plug is electrically connected to one of the plurality of antenna units; and 2-7) forming a third layer of a plurality of antennas antenna units, on the surface of the second dielectric layer, wherein the third layer of the plurality of antenna units are distributed in an array, wherein the array is an annulus, wherein the space between two adjacent antenna units in the third layer is fixed or unfixed.

Preferably, the method further comprises: repeating step 2-5), step 2-6), and step 2-7) at least once after step 2-7).

DESCRIPTION OF COMPONENT REFERENCE SIGNS

Figure 1:
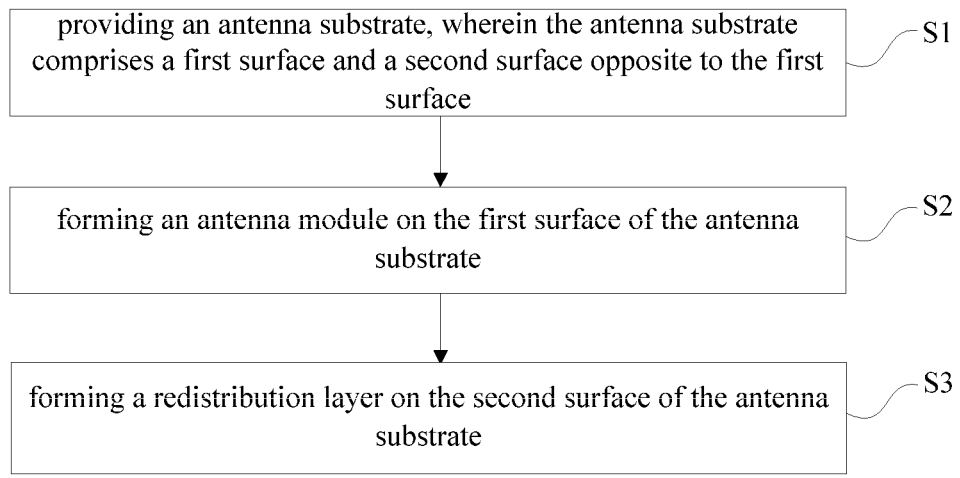
FIG. 1 illustrates a flowchart disclosing a method for fabricating a semiconductor structure with an antenna, according to embodiment 1 of the present application.

10 Antenna substrate
11 Antenna module
111 Antenna unit
112 Dielectric layer
113 Conductive plug
12 Redistribution layer
121 Insulating layer
122 Metal wire layer
123 Under-Bump Metal layer

DETAILED DESCRIPTION OF THE PREFERRED EMBODIMENTS

The implementation modes of the present disclosure will be described below through specific examples. One skilled in the art can easily understand other advantages and effects of the present disclosure according to contents disclosed in the description. The present disclosure may also be implemented or applied through other different implementation modes, and various modifications or changes may be made to all details in the description based on different points of view and applications without departing from the spirit of the present disclosure.

It needs to be stated that the drawings provided in these embodiments are just used for schematically describing the basic concept of the present disclosure, thus only illustrate components only related to the present disclosure and are not drawn according to the numbers, shapes and sizes of components during actual implementation, the configuration, number and scale of each component during actual implementation thereof may be freely changed, and the component layout configuration thereof may be more complex.

Embodiment 1

Referring to FIG. 1, the present disclosure provides a method for fabricating a semiconductor structure with an antenna, including the following steps:

1) providing an antenna substrate, wherein the antenna substrate comprises a first surface and a second surface opposite to the first surface;
2) forming an antenna module on the first surface of the antenna substrate; and
3) forming a redistribution layer on the second surface of the antenna substrate.

Figure 2:
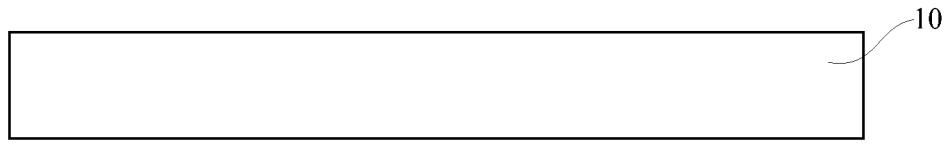
FIG. 2 to FIG. 3 illustrate cross sectional views after step 1) and step 2) of a method for fabricating a semiconductor structure with an antenna according to embodiment 1 of the present disclosure.
Figure 3:
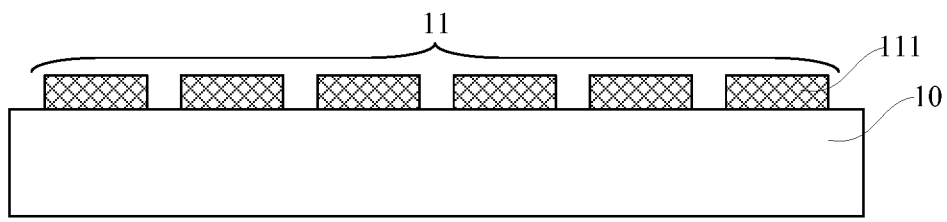

In step 1), referring to step S1 in FIG. 1. An antenna substrate 10 in FIG. 2 is provided, comprises a first surface and a second surface opposite to the first surface.

As an example, the antenna substrate 10 may be a substrate that can play a role of supporting carrier, preferably, the antenna substrate 10 is a substrate with less antenna signal loss, more preferably, in this embodiment, the antenna substrate 10 is: a glass substrate, a silicon substrate, a Roger 5880™ substrate, a polymer substrate or a composite substrate, the composite substrate may include one or different organic materials, and one or different inorganic materials.

As an example, the shape of the antenna substrate 10 may be set according to actual needs, and the shape of the antenna substrate 10 may be rectangular, circular, hexagonal, triangular or trapezoidal, etc., which is not limited herein.

In step 2), referring to step S2 in FIG. 1, and cross sectional views in FIG. 3 to FIG. 7, an antenna module 11 is formed on the first surface of the antenna substrate 10.

In one example, as illustrated in FIG. 3 to FIG. 6, forming the antenna module 11 on the first surface of the antenna substrate 10 comprises: forming a layer which comprises a plurality of antenna units 111 on the first surface of the antenna substrate 10 as the antenna module 11, wherein the plurality of antenna units 111 are distributed in an array, distributed in an annulus, or irregularly distributed in a plane of the first surface of the antenna substrate 10, and the antenna units 111 are block antennas or spiral antennas.

Specifically, an antenna material layer may be formed on the first surface of the antenna substrate 10, then the excessive antenna material layer may be removed by adopting a photo-etching process, and the reserved antenna material layer is used as a plurality of the antenna units 111. In other examples, a graphical mask layer with an opening may be formed on the first surface of the antenna substrate 10, and the opening defines the shape and position of the antenna unit 111; then, an antenna material layer is deposited in the opening to form the antenna units 111; and finally, the graphical mask layer is removed.

Figure 4:
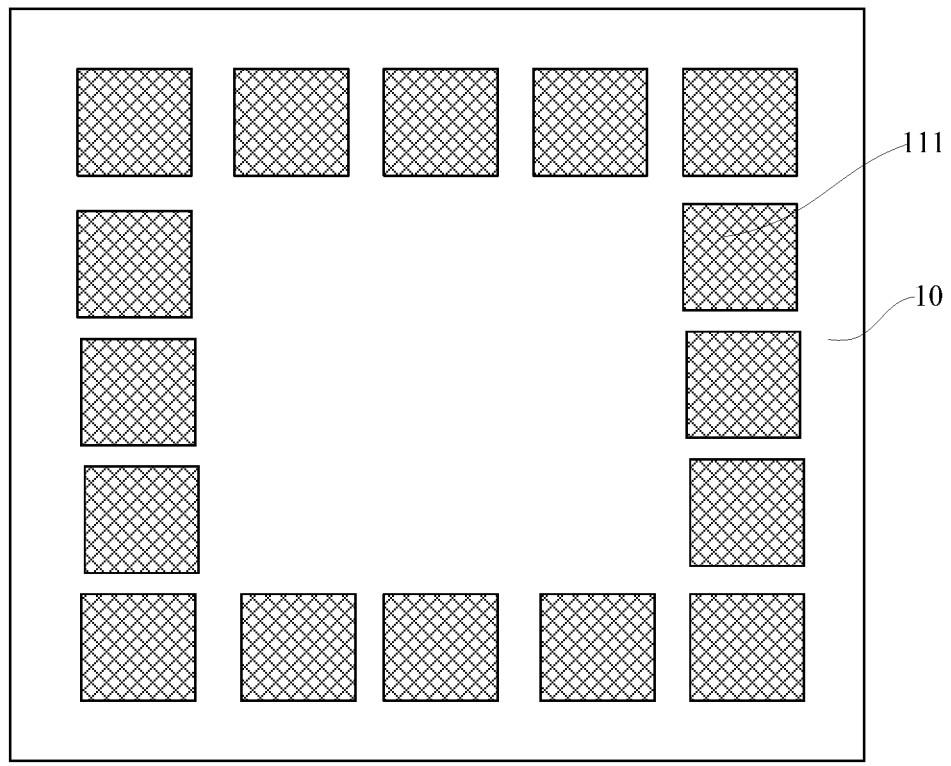
FIGS. 4-6 illustrate top views of exemplary antenna modules according to embodiments of the present disclosure.
Figure 5:
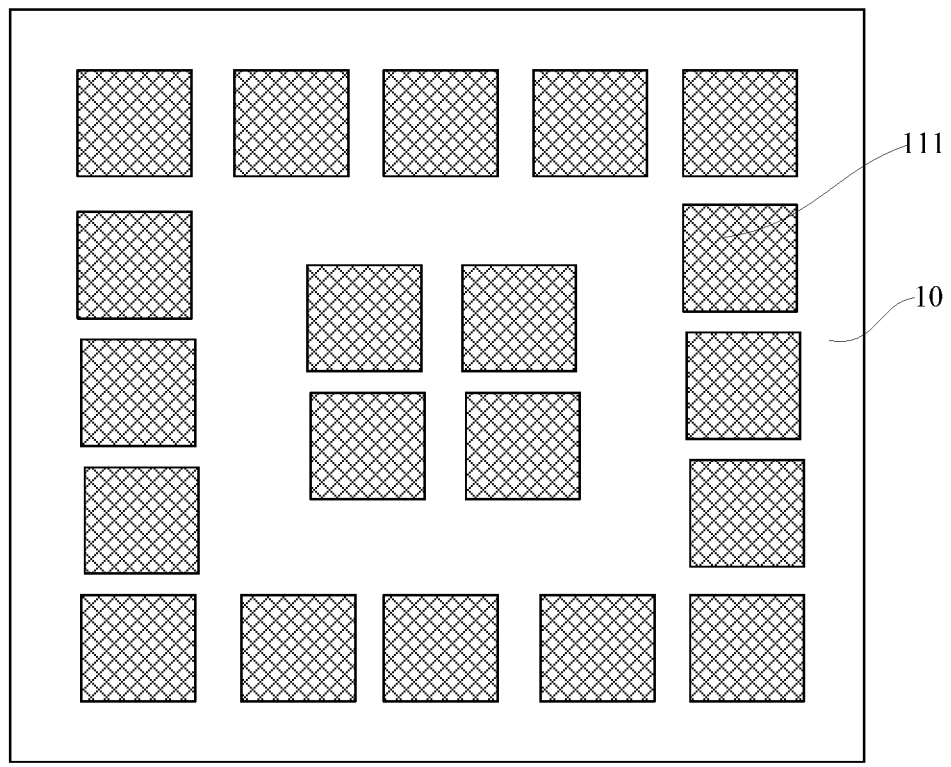
Figure 6:
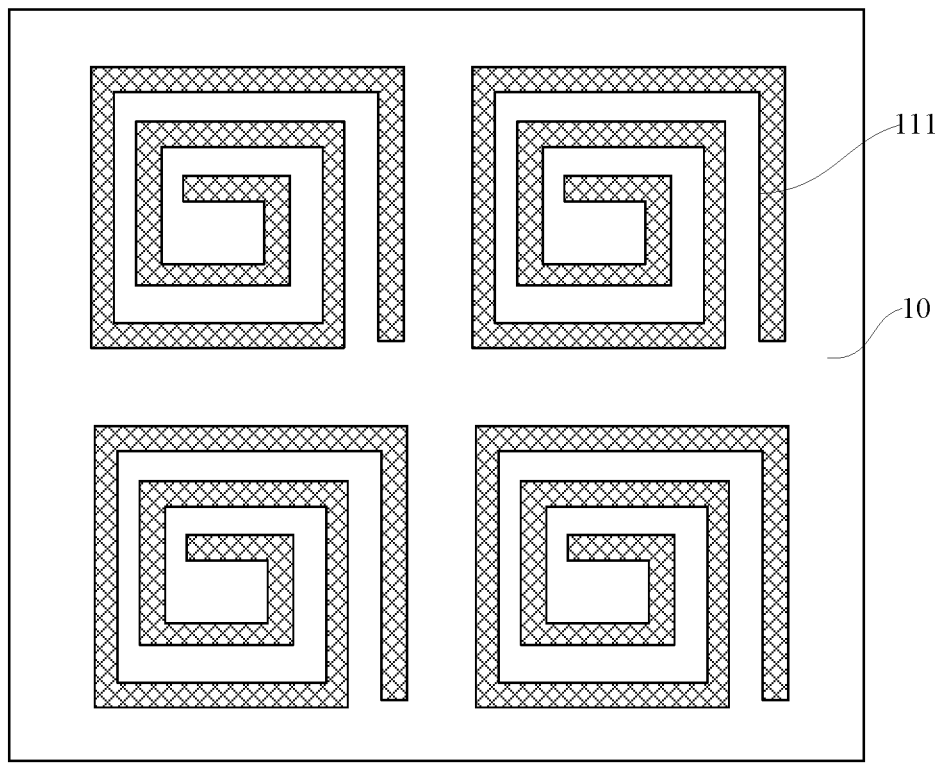

As an example, the antenna units 111 may be distributed in any shape on the first surface of the antenna substrate 10 in a plane of the antenna substrate 10, and the antenna units 111 may be antennas with any shape including the block antennas or the spiral antennas. Wherein, FIG. 4 illustrates an example that the antenna units 111 are block antennas, and the block antennas are distributed in a rectangular ring shape in a plane of the antenna substrate 10's first surface; FIG. 5 illustrates an example that the antenna units 111 are block antennas, and the block antennas are arranged in a rectangular ring shape and at its center at a plane of the antenna substrate 10's first surface; FIG. 6 illustrates an example that the antennas are rectangular spiral antennas, and the rectangular spiral antennas are distributed in an array at the plane of the antenna substrate 10's first surface.

It needs to be noted that, when the antenna units 111 are block antennas, the block antennas may be metal blocks; and when the antenna units 111 are spiral antennas, the spiral antennas may be formed by winding a metal wire into a spiral shape. In addition to the rectangular spiral antennas illustrated in FIG. 6, the antenna units 111 may be other spiral antennas, such as circular spiral antennas.

Figure 7:
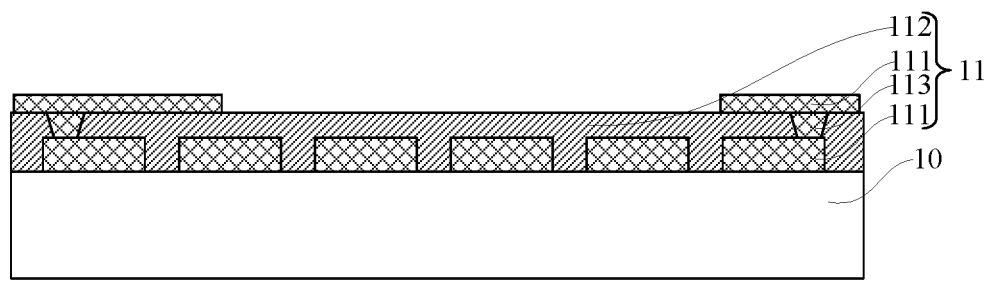
FIG. 7 illustrates a cross sectional view after step 2) of forming an antenna module on a first surface of an antenna substrate according to embodiment 1 of the present disclosure.

In another example, referring to FIG. 7, the antenna module 11 comprises a plurality of the antenna units 111, the plurality of antenna units 111 are distributed in two layers stacked with a space from each other on the first surface of the antenna substrate 10, and two adjacent layers of the antenna units 111 are connected through a conductive plug 113; and forming the antenna assembly 11 on the first surface of the antenna substrate 10 comprises the following steps:

2-1) forming a first layer of antennas comprising a plurality of antenna units 111 on the first surface of the antenna substrate 10, wherein the plurality of the antenna units 111 in the first layer of antennas are distributed in an array, distributed in an annulus, or irregularly distributed in a plane of the first surface of the antenna substrate 10, and the antenna units 111 are block antennas or spiral antennas;

2-2) forming a first dielectric layer 112 on the first surface of the antenna substrate 10, wherein the first dielectric layer 112 covers the antenna units 111;

2-3) forming a conductive plug 113 in the first dielectric layer 112, wherein the conductive plug 113 is electrically connected to the antenna units 111; and 2-4) forming a second layer of antennas comprising a plurality of the antenna units 111 on the surface of the first dielectric layer 112, wherein the plurality of antenna units 111 in the second layer of antennas are distributed in an array, distributed in an annulus, or irregularly distributed in a plane of the first surface of the antenna substrate 10.

In another example, the plurality of antenna units 111 are also distributed in three layers stacked with a space from each other on the first surface of the antenna substrate 10. After step 2-4), the method further comprises the following steps:

2-5) forming a second dielectric layer 112 on the surface of the first dielectric layer 112, wherein the second dielectric layer 112 covers the antenna units 111 formed in step 2-4);

2-6) forming a conductive plug 113 in the second dielectric layer 112 formed in step 2-5), wherein the conductive plug 113 is electrically connected to the antenna units 111 formed in step 2-4); and 2-7) forming a third layer of antennas comprising a plurality of the antenna units 111 on the surface of the second dielectric layer 112 formed in step 2-5), wherein the plurality of antenna units 111 in the third layer of antennas are distributed in an array, distributed in an annulus, or irregularly distributed in a plane of the first surface of the antenna substrate 10.

In another example, the plurality of antenna units 111 are also distributed in more than three layers stacked with a space from each other on the first surface of the antenna substrate 10. After step 2-7), the method further comprises repeating step 2-5), step 2-6), and step 2-7) at least once.

As an example, in each of the above-mentioned examples, the material of the dielectric layer 112 may include, but not limited to, silicon dioxide or PET (polyethylene terephthalate), which is fabricated by adopting processes such as spin coating, chemical vapor deposition (CVD) or plasma enhanced CVD. The materials of the antenna units 111 and the conductive plug 113 may include, but not limited to, a combination of copper, aluminum, nickel, gold, silver, tin, or titanium, wherein the antenna units 111 and the conductive plug 113 may be fabricated by adopting physical vapor deposition (PVD), chemical vapor deposition (CVD), sputtering, electroplating or electrodeless plating.

Figure 8:
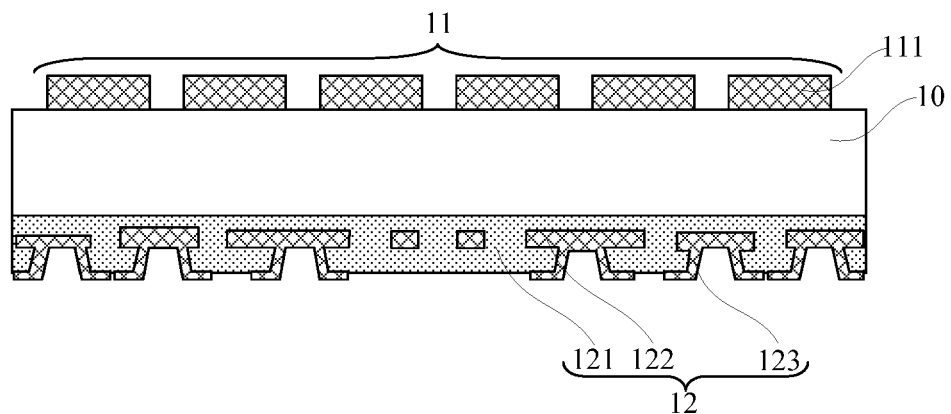
FIGS. 8-9 illustrate cross sectional views of a semiconductor structure with an antenna according to embodiments of the present application.
Figure 9:
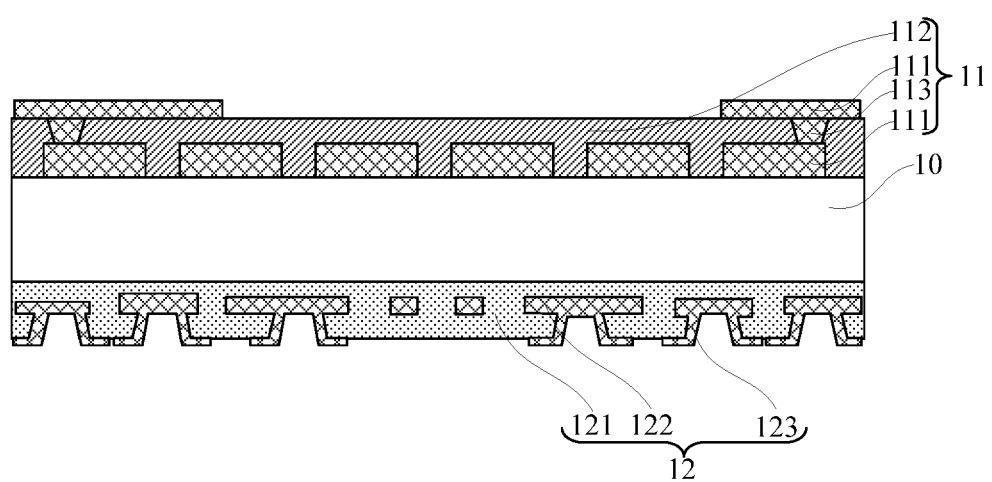

In step 3), referring to step S3 in FIG. 1, FIG. 8 and FIG. 9, a redistribution layer 12 is formed on the second surface of the antenna substrate 10.

In one example, the redistribution layer 12 comprises a metal wire layer 122, at least one insulating layer 121, and an Under-Bump Metal layer 123, and forming the redistribution layer 12 on the second surface of the antenna substrate 10 comprises the following steps:

3-1) forming the metal wire layer 122 on the second surface of the antenna substrate 10;

3-2) forming the insulating layer 121 on the second surface of the antenna substrate 10, wherein the insulating layer 121 encloses the metal wire layer 122, and wherein the top surface of the insulating layer 121 is higher than the top surface of the metal wire layer 122;

3-3) forming an opening in the insulating layer 121, wherein the opening exposes part of the metal wire layer 122; and 3-4) forming the Under-Bump Metal layer 123 in the opening, wherein the Under-Bump Metal layer 123 is electrically connected to the metal wire layer 122.

In another example, the redistribution layer 12 comprises a metal wire layer 122, at least one insulating layer 121, and an Under-Bump Metal layer 123, and forming the redistribution layer 12 on the second surface of the antenna substrate 10 comprises the following steps:

3-1) forming a first insulating layer 121 on the second surface of the antenna substrate 10;

3-2) forming the metal wire layer 122 on the surface of the first insulating layer 121;

3-4) forming a second insulating layer of the same material as the first insulating layer on the top surface of the first insulating layer 121, wherein the second insulating layer covers the metal wire layer 122, and the first and the second insulating layer merge outside the metal wire layer 122;

3-5) forming openings in the second insulating layer 121, wherein the opening exposes the metal wire layer 122; and 3-6) forming the Under-Bump Metal layer 123 in the opening.

As an example, in the above-mentioned example, the material of the metal wire layer 122 may be, but not limited to, a combination of copper, aluminum, nickel, gold, silver or titanium, and the metal wire layer 122 may be formed by adopting a process such as PVD, CVD, sputtering, electroplating or electrodeless plating. The material of the insulating layer 121 may be a low k dielectric material. Specifically, the material of the insulating layer 121 may be one of epoxy resin, silica gel, Polyimide (PI), Polybenzoxazole (PBO), Benzocyclobutene (BCB) silicon oxide, phosphorosilicate glass and fluorine-containing glass, and the insulating layer 121 may be formed by adopting processes such as spin coating, CVD or plasma enhanced CVD.

It needs to be noted that, in other examples, step 2) and step 3) can also be interchanged, that is, the redistribution layer 12 may be formed on the second surface of the antenna substrate 10, and the antenna units 11 may be formed on the first surface of the antenna substrate 10.

Embodiment 2

Referring to FIG. 8 and FIG. 9. This embodiment further provides a semiconductor structure with an antenna. The semiconductor structure with the antenna comprises: an antenna substrate 10 comprising a first surface and a second surface opposite to the first surface; an antenna module 11 disposed on the first surface of the antenna substrate 10; and a redistribution layer 12 disposed on the second surface of the antenna substrate 10.

As an example, the antenna substrate 10 may be a substrate that can play a supporting role, preferably, the antenna substrate 10 is a substrate with less antenna signal loss, more preferably, in this embodiment, the antenna substrate 10 may be: a glass substrate, a silicon substrate, a Roger 5880™ substrate, a polymer substrate, or a composite substrate, the composite substrate may be one or multiple different organic materials, and one or multiple different inorganic materials.

As an example, the shape of the antenna substrate 10 may be set according to actual needs, and the shape of the antenna substrate 10 may be rectangular, circular, hexagonal, triangular or trapezoidal, etc., which is not limited herein.

As an example, the antenna module 11 comprises at least one antenna unit 111, and the antenna unit 111 is a block antenna or a spiral antenna.

In one example, as illustrated in FIG. 8, the antenna module 11 includes a plurality of the antenna units 111, and the plurality of antenna units 111 are distributed in a single layer on the first surface of the antenna substrate 10.

As an example, the antenna units 111 may be distributed in any shape on the first surface of the antenna substrate 10 in a plane of the antenna substrate 10, and the antenna units 111 may be antennas with any shape including the block antennas or the spiral antennas. Wherein, FIG. 4 illustrates an example that the antenna units 111 are block antennas, and the block antennas are distributed in a rectangular ring shape in a plane of the antenna substrate 10 on the first surface of the antenna substrate 10; FIG. 5 illustrates an example that the antenna units 111 are block antennas, and the block antennas are distributed in a rectangular ring shape with the block antenna in a center in a plane of the antenna substrate 10 on the first surface of the antenna substrate 10; and FIG. 6 illustrates an example that the antennas are rectangular spiral antennas, and the rectangular spiral antennas are distributed in an array in a plane of the antenna substrate 10 on the first surface of the antenna substrate 10.

It needs to be noted that, when the antenna units 111 are block antennas, the block antennas may be metal blocks; and when the antenna units 111 are spiral antennas, the spiral antennas may be formed by winding a metal wire into a spiral shape. In addition to the rectangular spiral antennas illustrated in FIG. 6, the antenna units 111 may be any other spiral antennas, such as circular spiral antennas.

In another example, the antenna module 11 comprises a plurality of the antenna units 111, the plurality of antenna units 111 are distributed in a plurality of layers stacked with a space from each other on the first surface of the antenna substrate 10, and two adjacent layers of the antenna units 111 are connected; wherein FIG. 9 illustrates an example that the plurality of antenna units 111 are distributed in two layers stacked with a space from each other on the first surface of the antenna substrate 10.

As an example, the antenna module 11 further comprises a dielectric layer 12, the dielectric layer 112 is disposed between two adjacent layers of the antenna units 111, FIG. 9 illustrates an example that the antenna units are distributed in two layers, the dielectric layer 112 covers the first layer of antenna units 111, and the second layer of antenna units 111 is disposed on the surface of the dielectric layer 112.

As an example, the antenna module 11 further comprises a conductive plug 113, the conductive plug 113 is disposed within the dielectric layer 112, disposed between two adjacent layers of the antenna units 111, and electrically connecting the two adjacent layers of antenna units 111.

As an example, in each of the above-mentioned examples, the material of the dielectric layer 112 may include, but not limited to, silicon dioxide or PET (polyethylene terephthalate), which is fabricated by adopting processes such as spin coating, chemical vapor deposition (CVD) or plasma enhanced CVD (PECVD). The materials of the antenna units 111 and the conductive plug 113 may include, but not limited to, one or a combination of copper, aluminum, nickel, gold, silver, tin, or titanium, wherein the antenna units 111 and the conductive plug 113 may be fabricated by adopting physical vapor deposition (PVD), chemical vapor deposition (CVD), sputtering, electroplating or electrodeless plating.

As an example, the redistribution layer 12 comprises: an insulating layer 121 disposed on the second surface of the antenna substrate 10; at least one metal wire layer 122 disposed in the insulating layer 121; and an Under-Bump Metal layer 123 disposed on a surface of the insulating layer 121, and electrically connecting to the metal wire layer 122.

As an example, in the above-mentioned example, the material of the metal wire layer 122 may be, but not limited to, copper, aluminum, nickel, gold, silver titanium, or a combination thereof, and the metal wire layer 122 may be formed by adopting a process such as PVD, CVD, sputtering, electroplating or electrodeless plating. The material of the insulating layer 121 may be a low k dielectric material. Specifically, the material of the insulating layer 121 may be epoxy resin, silica gel, PI, PBO, BCB, silicon oxide, phosphorosilicate glass or fluorine-containing glass, and the insulating layer 121 may be formed by adopting processes such as spin coating, CVD or plasma enhanced CVD.

To sum up, the present application provides a semiconductor structure with an antenna and a method making the same, wherein the semiconductor structure with the antenna comprises: an antenna substrate comprising a first surface and a second surface opposite to the first surface; an antenna module disposed on the first surface of the antenna substrate; and a redistribution layer disposed on the second surface of the antenna substrate. The semiconductor structure with the antenna according to the present application provides the antenna module and the redistribution layer on two opposite surfaces of the antenna substrate, the material of the antenna substrate for supporting the antenna module can be selected according to actual needs, to allow more choices. So the loss of the antenna signal can be reduced through the selection of the antenna substrate. The redistribution layer is provided on the surface of the antenna substrate, the redistribution layer is used for bonding the semiconductor chips, different semiconductor chips can be selected and replaced to be bonded on the redistribution layer to match the antenna module according to the needs, as a result the application range is widened. Thus, the process is more flexible.

The above-mentioned embodiments are only used for exemplarily describing the principle and effects of the present disclosure instead of limiting the present disclosure. One skilled in the art may make modifications or changes to the above-mentioned embodiments without departing from the spirit and scope of the present disclosure. Therefore, all equivalent modifications or changes made by those who have common knowledge in the art without departing from the spirit and technical thought disclosed by the present disclosure shall be still covered by the claims of the present disclosure.

The invention claimed is:

1. A semiconductor structure with an antenna, comprising:
an antenna substrate including a first surface and a second surface opposite to the first surface;
an antenna module disposed on the first surface of the antenna substrate, wherein the antenna module comprises a first layer of antenna units and a second layer of antenna units, wherein the first layer of antenna units are disposed in a plane of the first surface of the antenna substrate and are distributed in an array, which has a shape of an annulus, wherein the first layer of antenna units have fixed or unfixed spaces between two adjacent antenna units of the first layer of antenna units;
a first dielectric layer covering the first layer of antenna units on the first surface of the antenna substrate;
a conductive plug configured in the first dielectric layer and arranged to electrically connect to one of the first layer of antenna units;
a second layer of antenna units disposed on a surface of the first dielectric layer, wherein the second layer of antenna units are distributed in an array, wherein the array has a shape of an annulus, wherein the second layer of antenna units have fixed or unfixed spaces between two adjacent antenna units in the second layer of antenna units; and
a redistribution layer disposed on the second surface of the antenna substrate.

2. The semiconductor structure with the antenna according to claim 1, wherein the antenna substrate comprises a glass substrate, a silicon substrate, a polymer substrate, or a composite substrate.

3. The semiconductor structure with the antenna according to claim 1, wherein the first layer of antenna units each is a block antenna or a spiral antenna.

4. The semiconductor structure with the antenna according to claim 3, wherein the plurality of antenna units is distributed in a single layer on the first surface of the antenna substrate.

5. The semiconductor structure with the antenna according to claim 3, wherein the antenna module further comprises a third layer of antenna units, wherein the first layer, the second layer and the third layer of antenna units constitute a stack of antenna layers, and wherein two of said adjacent antenna layers are connected to each other.

6. The semiconductor structure with the antenna according to claim 5, wherein the antenna module further comprises a second dielectric layer, and wherein the second dielectric layer is disposed between the second and the third antenna layers.

7. The semiconductor structure with the antenna according to claim 6, wherein each of the first, the second, and the third antenna layer comprises an array of antennas, distributed in an annulus, having regular or irregular spaces from each other.

8. The semiconductor structure with the antenna according to claim 5, further comprising more than three layers of antenna units stacked with a space from each other and distributed in arrays on the first surface of the antenna substrate.

9. The semiconductor structure with the antenna according to claim 1, the redistribution layer comprises:
an insulating layer disposed on the second surface of the antenna substrate;
at least one metal wire layer disposed in the insulating layer; and
an under-bump metal layer disposed on a surface of the insulating layer, and electrically connecting to the metal wire layer.

* * * * *